(12) United States Patent
Senoo et al.

(10) Patent No.: US 7,073,265 B2
(45) Date of Patent: Jul. 11, 2006

(54) STACKED PIEZOELECTRIC DEVICE AND METHOD OF FABRICATING SAME

(75) Inventors: Takeshi Senoo, Anjo (JP); Nozomu Okumura, Nagoya (JP); Yasuhiro Suzuki, Nagoya (JP); Isao Mizuno, Chiryu (JP); Akira Fujii, Toyoake (JP)

(73) Assignee: Denso Corporation (JP)

( * ) Notice: Subject to any disclaimer, the term of this patent is extended or adjusted under 35 U.S.C. 154(b) by 122 days.

(21) Appl. No.: 10/776,335

(22) Filed: Feb. 12, 2004

(65) Prior Publication Data

US 2004/0178703 A1    Sep. 16, 2004

(30) Foreign Application Priority Data

Feb. 12, 2003  (JP)  ............................. 2003-034173
Jan. 9, 2004   (JP)  ............................. 2004-004476

(51) Int. Cl.
    *H01L 41/08*    (2006.01)
(52) U.S. Cl. .................... 30/364; 310/363; 310/328
(58) Field of Classification Search .......... 310/332, 310/328, 363, 364, 366
    See application file for complete search history.

(56) References Cited

U.S. PATENT DOCUMENTS 5,233,260 A * 8/1993 Harada et al. ............... 310/328

2002/0017832 A1   2/2002 Murai et al.

FOREIGN PATENT DOCUMENTS

| JP | 57-30308    | 2/1982  |
| JP | 2001-340851 | 12/2000 |
| JP | 2001-244519 | 9/2001  |
| JP | 2002-54526  | 2/2002  |

* cited by examiner

*Primary Examiner*—Mark Budd
(74) *Attorney, Agent, or Firm*—Nixon & Vanderhye PC

(57) ABSTRACT

To provide a stacked piezoelectric device which is inexpensive and excellent in bonding strength between a piezoelectric layer and an internal electrode layer, the piezoelectric device comprises piezoelectric layers and internal electrode layers containing not less than 50 percent by weight of Cu stacked alternately. Between the internal electrode layer and the piezoelectric layer, there is a diffusion region formed by mutual diffusion of components of the internal electrode layer and the piezoelectric layer to the other layer and comprising at least one component of the piezoelectric material and Cu. The diffusion region occupies not less than 90 percent of area of interface between the internal electrode layer and the piezoelectric layer, and a thickness of the diffusion region is not more than 10 percent of a thickness of the internal electrode layer. A piezoelectric material constituting the piezoelectric layer preferably comprises PZT which is a Pb(Zr,Ti)O$_3$— based oxide having a perovskite structure, and Pb, Cu, and O elements coexist in the diffusion region.

10 Claims, 6 Drawing Sheets

STACKED PIEZOELECTRIC DEVICE AND METHOD OF FABRICATING SAME

BACKGROUND OF THE INVENTION

1. Field of the Invention

The present invention relates to a stacked piezoelectric device used for a piezoelectric actuator and the like, and a method of fabricating the same.

2. Description of the Related Art

A piezoelectric device is characterized by generating force or displacement when voltage is applied, and by generating voltage when force is applied, and it has a wide range of application such as various actuators and sensors. A stacked piezoelectric device, which is a concept which includes a stacked piezoelectric actuator comprising a plurality of piezoelectric layers, is often used in order to obtain large generated force or displacement when it is used for an actuator and the like.

A common stacked piezoelectric device employs an expensive metal such as Ag/Pd as an internal electrode material from the restrictions on the manufacturing process, and therefore the manufacturing cost tends to become high remarkably as the number of stacked layers increases.

In order to attempt a cost reduction, for example, Japanese Unexamined Patent Publication No. 2000-340851 discloses that an internal electrode is formed by nonelectrolytic plating of Cu. Japanese Unexamined Patent Publication No. 2001-244519 discloses that piezoelectric material and Cu foil are bonded directly in the range of 500 to 700 degrees centigrade. However, a stacked piezoelectric device manufactured according to this prior art has an inadequate bonding strength for an operation with high load, and it lacks reliability. Moreover, Japanese Unexamined Patent Publication No. 2001-244519 discloses that bonding at a temperature of not less than 800 degrees centigrade is not preferable because it deteriorates the quality of piezoelectric material.

SUMMARY OF THE INVENTION

The present invention has been achieved in view of the problems of prior art, and the object thereof is to provide a stacked piezoelectric device which is inexpensive and excellent in bonding strength between a piezoelectric layer and an internal electrode layer, and a method of fabricating the same.

According to a first aspect of the invention, there is provided a stacked piezoelectric device comprising piezoelectric layers composed of a piezoelectric material and internal electrode layers containing Cu, each of the piezoelectric layers being stacked alternately with each of the internal electrode layers, wherein the internal electrode layer contains not less than 50 percent by weight of Cu element, and wherein, between the internal electrode layer and the piezoelectric layer, there is a diffusion region formed by diffusion of a component of each layer to the other layer and comprising at least one component of the piezoelectric material and Cu.

A stacked piezoelectric device according to the present invention, as mentioned above, employs a Cu-based material containing not less than 50 percent by weight of Cu element as an internal electrode layer. Therefore, compared with conventional stacked piezoelectric devices employing a noble metal such as Ag/Pd and the like, material cost can be reduced significantly, and a cheaper stacked piezoelectric device can be obtained.

In addition, the stacked piezoelectric device has a diffusion region formed between the internal electrode layer and the piezoelectric layer. The diffusion region is formed by mutual diffusion of components of the internal electrode layer and the piezoelectric layer to the other layer and comprises at least one component of the piezoelectric material and Cu constituting the internal electrode layer. As this diffusion region exists in an interface between the internal electrode layer and the piezoelectric layer, both layers bond to each other with sufficient bonding strength.

Thus, the present invention provides a stacked piezoelectric device which is inexpensive and has a sufficiently high bonding strength between an internal electrode layer and the piezoelectric layer by using Cu as a principal component of an internal electrode layer and forming a diffusion region between an internal electrode layer and a piezoelectric layer.

According to a second aspect of the invention, there is provided a method of fabricating a stacked piezoelectric device comprising piezoelectric layers composed of a piezoelectric material and internal electrode layers containing Cu, each of the piezoelectric layers being stacked alternately with each of the internal electrode layers, comprising the steps of:

a piezoelectric layer calcination step of calcining a ceramic green sheet as a piezoelectric material to obtain a piezoelectric layer;

a stack fabrication step of stacking the piezoelectric layers alternately with layers of electrode material containing Cu to fabricate a stack; and a heat-bonding step of bonding internal electrode layers composed of the electrode material and the piezoelectric layers by heating the stack at a temperature higher than 750 degrees centigrade and not higher than the melting point of Cu in an oxidation-inhibiting atmosphere for preventing Cu from oxidizing while a predetermined load is applied to the stack in the stacking direction.

A fabrication method according to the present invention performs the stack fabrication step and the heat-bonding step after performing the piezoelectric layer calcination step for obtaining a calcined piezoelectric layer as mentioned above. Therefore, the stacked piezoelectric device can be fabricated without having any influence on the calcination treatment for obtaining piezoelectric layers.

The heat-bonding step is performed, as mentioned above, in an oxidation-inhibiting atmosphere for preventing Cu from oxidizing while a predetermined load is applied to the stack in the stacking direction. The heating temperature is controlled to the temperature range higher than 750 degrees centigrade and not higher than the melting point of Cu. When the heating temperature is not higher than 750 degrees centigrade, sufficient bonding strength of an internal electrode layer and a piezoelectric layer cannot be obtained. On the other hand, when the heating temperature is higher than the melting point of Cu which is about 1083 degrees centigrade, there is a problem that it is difficult to form homogeneous internal electrode layers.

The load applied to the stack needs to be large enough as to sufficiently bond a piezoelectric layer and an electrode material together without causing damage to a piezoelectric layer, and the optimum value of the load varies with the composition of the piezoelectric material constituting the piezoelectric layer, the thickness of the piezoelectric layer, and the like. For example, when a piezoelectric layer is PZT with a thickness of about 100 micrometers, the load is preferably 1 to 10 MPa.

By performing the heat-bonding step under the above-mentioned conditions, a diffusion phenomenon occurs between an internal electrode layer with a Cu base and a piezoelectric layer, and a diffusion region comprising at least one component of the piezoelectric material and Cu is formed. By forming this diffusion region in an interface between an internal electrode layer and a piezoelectric layer, the bonding strength of both layers can sufficiently be enhanced.

Thus, a fabrication method of the present invention can provide a stacked piezoelectric device which is inexpensive by using Cu as a principal component of an internal electrode layer and has an excellent bonding strength between an internal electrode layer and a piezoelectric layer.

DETAILED DESCRIPTION OF THE INVENTION

Figure 1:
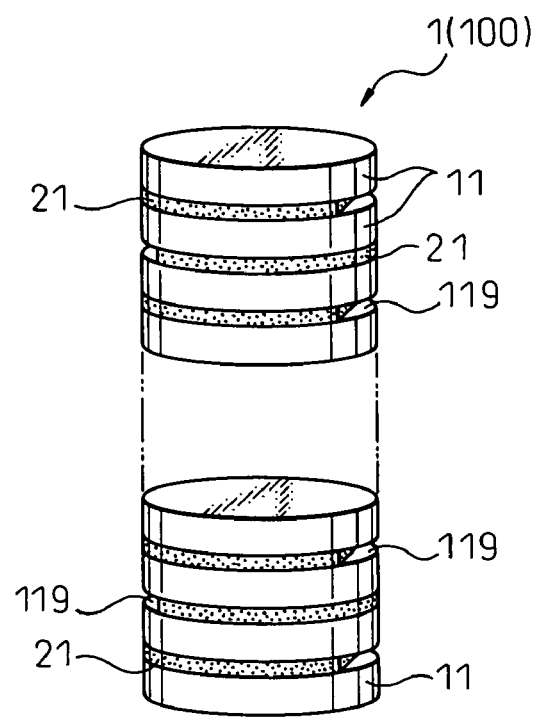
FIG. 1 is a diagram illustrating the structure of a stacked piezoelectric device according to Example 1.

A stacked piezoelectric device according to the present invention comprises a plurality of internal electrode layers and a plurality of piezoelectric layers, each internal electrode layer being stacked alternately with each piezoelectric layer. A thickness and an area of each internal electrode layer and piezoelectric layer as well as a number of layers are selected according to the intended use of a stacked piezoelectric device. The stacked piezoelectric device may have a structure comprising a buffer part, a dummy part, and the like, in the stacking direction end of a stack of internal electrode layers and piezoelectric layers stacked alternately. A stacked piezoelectric device usually has a structure comprising an external electrodes connecting to internal electrode layers to supply voltage to the internal electrode layers through the external electrodes and obtain piezoelectric effects.

The internal electrode layer of the stacked piezoelectric device contains not less than 50 percent by weight of Cu. When the Cu content is less than 50 percent by weight, there are problems such as a decline in conductivity of the internal electrode layer. Although the permissible maximum of Cu content is 100 percent by weight, it is practically difficult to realize 100 percent by weight of Cu from the constraint on production of Cu-containing material. Materials which can contain a high purity of Cu, such as Cu foil and Cu plating film, can be used as a material forming the internal electrode layer as mentioned later.

The content of Cu element in the internal electrode layer is preferably not less than 95.0 percent by weight. In such a case, the conductivity of the whole internal electrode layer is easily secured, taking advantage of an excellent conductivity of Cu.

The content of Cu element in the internal electrode layer is most preferably not less than 99.0 percent by weight. Thereby, the very excellent conductivity can be secured to improve the displacement performance of the stacked piezoelectric device.

The internal electrode layer is preferably composed of a pure copper metal containing not less than 99.0 percent by weight of Cu element. In this case, as the internal electrode layer is formed using a pure copper metal, the internal electrode layer is easily formed. The shape of the pure copper metal includes, but is not limited to, Cu foil (copper foil).

The internal electrode layer may also be composed of copper alloys containing not less than 95 percent by weight of Cu element. In this case, various copper alloys can be used. Specific examples of copper alloys include a beryllium copper, a red brass, a phosphor bronze, and the like.

The diffusion region preferably occupies not less than 90 percent of area of the interface between the internal electrode layer and the piezoelectric layer, and a thickness of the diffusion region is preferably not more than 10 percent of a thickness of the internal electrode layer.

The diffusion region can be identified, for example, by analyzing a section of a bonding portion of an internal electrode layer and a piezoelectric layer by an elementary analysis with an X-ray microanalyser (EPMA) and the like. A thickness of this diffusion region can be determined by change of Cu concentration and the like. When the diffusion region is formed only in less than 90 percent of area of the whole interface, there is a possibility that a sufficient bonding strength may not be obtained. When a thickness of the diffusion region exceeds 10 percent of a thickness of the internal electrode layer, there is a problem that the piezoelectric properties of a piezoelectric layer decline. On the other hand, as the improvement effect in bonding strength is not sufficiently obtained when a thickness of the diffusion region is too small, a lower limit of the thickness of the diffusion region is preferably 0.1 percent of a thickness of the internal electrode layer.

The diffusion region preferably is a region having a Cu concentration of 1 percent to 0.95A percent by weight, wherein A represents Cu element content in percent by weight in the internal electrode layer. Forming of a diffusion region in which Cu concentration is changing in the above-mentioned range can enhance a bonding strength between an internal electrode layer and a piezoelectric layer certainly owing to the diffusion region. The Cu concentration is observable with EPMA.

A thickness of the diffusion region is preferably from 0.001 to 1 micrometer. When the thickness of the diffusion region is less than 0.001 micrometer, there is a possibility that diffusion in the diffusion region is insufficient and the bonding strength declines. On the other hand, when the thickness of the diffusion region exceeds 1 micrometer, there is a possibility of causing a decline in the electric conductivity of the internal electrode layer and a decline of the electric resistance of the piezoelectric layer. In order to be compatible in high bonding strength and high properties, it is preferable to form the diffusion region having a thickness of the above-mentioned range.

It is preferable that the diffusion region exists continuously in both sides of an interface of the internal electrode layer and the piezoelectric layer, and the interface locates in the diffusion region, and that a part, closer to the internal electrode layer than the interface, of the diffusion region has an oxygen (O) content of not more than 10 percent by weight. Thereby, $Cu_2O$ can be inhibited from being generated by further progress of diffusion at the time of a subsequent practical use.

It is preferable that a piezoelectric material constituting the piezoelectric layer comprises PZT which is a $Pb(Zr,Ti)O_3$-based oxide having a perovskite structure, and that Pb, Cu, and O elements coexist in the diffusion region.

Various ceramic materials exerting piezoelectric properties can be used as a piezoelectric material constituting the piezoelectric layer. In particular, the above-mentioned PZT (lead zirconate titanate) is the most suitable for a piezoelectric layer of a stacked piezoelectric device since it has very excellent piezoelectric properties. When this PZT is used, Pb and O contained in PZT and Cu of the internal electrode layer coexist in the diffusion region.

The stacked piezoelectric device preferably is a piezoelectric actuator for an injector used as a driving source of an injector. An injector is equipped with an automobile and the like and is used as fuel injection equipment of an internal combustion engine, and the environment in which it is used is very severe. Therefore, an injector with the built-in stacked piezoelectric device having an excellent bonding strength as a piezoelectric actuator is excellent in reliability and durability.

A fabrication method according to the present invention comprises at least a piezoelectric layer calcination step, a stack fabrication step, and a heat-bonding step.

Calcining conditions in the piezoelectric layer calcination step can be suitably selected according to the kind of piezoelectric material constituting the piezoelectric layer. As a piezoelectric layer is usually an oxide, calcination is performed in an oxidizing atmosphere.

The heating temperature in the heat-bonding step is preferably not lower than 850 degrees centigrade. It is more preferable to control the heating temperature to a temperature range higher than 850 degrees centigrade and not higher than the melting point of Cu. Heating to a temperature higher than 850 degrees centigrade can further improve the bonding strength of an internal electrode layer and a piezoelectric layer certainly.

Various materials can be used as an electrode material arranged between the piezoelectric layers in the stack fabrication step.

For example, the electrode material is preferably Cu foil. In this case, a targeted thickness of the internal electrode layer can be easily controlled by a thickness of the Cu foil (copper foil), and a stacked piezoelectric device excellent in dimensional accuracy can be fabricated comparatively easily. It is preferable to use Cu foil (copper foil) containing not less than 99.0 percent by weight of Cu element.

The electrode material can also be Cu plating film formed on the surface of the piezoelectric layer preferably. In this case, the electrode material can be easily arranged by forming Cu plating film (copper plating film) on one surface or both surfaces of one or both of piezoelectric layers sandwiching an internal electrode layer.

It is preferable that a piezoelectric material constituting the piezoelectric layer comprises PZT which is a $Pb(Zr,Ti)O_3$-based oxide having a perovskite structure, and that the stack is heated at a temperature of not less than 955 degrees centigrade in the heat-bonding step. By heating at a temperature of not less than 955 degrees centigrade in the heat-bonding step, Cu in the electrode material and Pb in the PZT act to form a Cu-rich liquid phase, which exhibits an action to fill the interstices in the interface between Cu foil and the PZT to obtain a homogeneous and satisfactory diffusion region, and a bonding strength of the internal electrode layer and the piezoelectric layer can be further improved.

The oxidation-inhibiting atmosphere in the heat-bonding step can be obtained by placing the stack in a furnace, filling the circumference of the stack with oxide ceramic powder, and evacuating the inside of the furnace to a vacuum degree of $1\times10^{-4}$ Pa to $10^5$ Pa. Examples of the oxide ceramic powder include PZT, lead zirconate, zirconia, alumina, and the like. In this case, a vacuum degree when evacuating is preferably $1\times10^{-4}$ to $10^5$ Pa as mentioned above. In the case of less than $1\times10^{-4}$ Pa, there is a possible problem that deterioration of PZT may be promoted. On the other hand, in the case of more than $10^5$ Pa, there is a possible problem that Cu may be oxidized. It is more preferable that the vacuum degree is not more than $10^2$ Pa. In this case, it is necessary to evacuate only before heat-treatment and just to maintain the airtightness for maintaining the vacuum condition during heating.

The oxidation-inhibiting atmosphere in the heat-bonding step may be also obtained by evacuating the inside of the furnace, in which the stack is placed, to a vacuum degree of $1\times10^{-4}$ Pa to $10^5$ Pa, and thereafter introducing inert gas into the furnace so that a pressure of not less than 1 Pa may be maintained in the furnace. Specific examples of the inert gas include nitrogen, argon, and the like. In this case, a vacuum degree when evacuating before introducing inert gas is preferably $1\times10^{-4}$ to $10^5$ Pa.

In the case of less than $1\times10^{-4}$ Pa, there is a possible problem that deterioration of PZT may be promoted. On the other hand, in the case of more than $10^5$ Pa, there is a possible problem that Cu may be oxidized. It is more preferable that the vacuum degree when evacuating before introducing inert gas is not more than $10^2$ Pa. When a pressure in the furnace by introduction of the inert gas is less than 1 Pa, there is a possible problem that deterioration of PZT may be promoted during heating. The maximum value of the pressure in the furnace is preferably an atmospheric pressure in order to avoid an increased equipment cost due to the additionally required pressurizing mechanism.

The oxidation-inhibiting atmosphere in the heat-bonding step may be also obtained by evacuating the inside of the furnace, in which the stack is placed, to a vacuum degree of $1\times10^{-4}$ Pa to $10^5$ Pa and, thereafter, controlling an oxygen partial pressure in the furnace in the predetermined range. In this case, the vacuum degree when evacuating is preferably $1\times10^{-4}$ to $10^5$ Pa. In the case of less than $1\times10^{-4}$ Pa, there is a possible problem that deterioration of PZT may be promoted. On the other hand, in the case of more than $10^5$ Pa, there is a possible problem that oxygen may not be sufficiently exhausted, and that subsequent control of the oxygen partial pressure may be difficult. It is more preferable that the vacuum degree when evacuating is not more than $10^2$ Pa. The oxygen partial pressure after evacuation can be controlled, for example, by installing a manometer and an oxygen analyzer in the furnace and introducing oxygen gas so that the predetermined pressure and concentration may be maintained in the furnace.

EXAMPLES

Example 1

A stacked piezoelectric device and a method of fabrication thereof according to an example of the present invention will be explained with reference to FIGS. 1 to 6.

A stacked piezoelectric device 1 according to this example comprises piezoelectric layers 11 composed of a piezoelectric material and internal electrode layers 21 containing Cu, and each of the piezoelectric layers 11 is stacked alternately with each of the internal electrode layers 21 as shown in FIG. 1.

Figure 2:
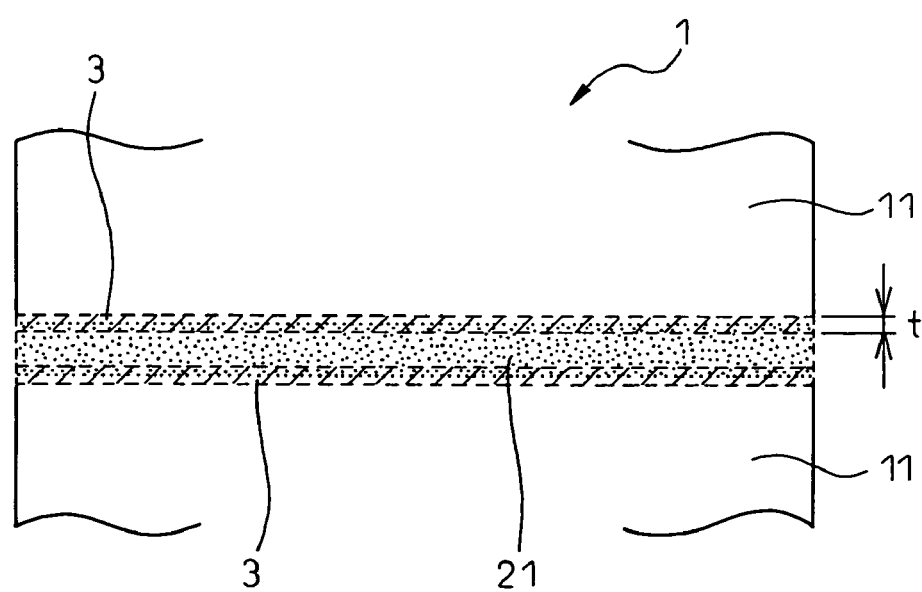
FIG. 2 is a diagram illustrating a diffusion region between a piezoelectric layer and an internal electrode layer in a stacked piezoelectric device according to Example 1.

The internal electrode layer 21 contains not less than 95 percent by weight of Cu. Between the internal electrode layers 21 and the piezoelectric layers 11, there is a diffusion region 3 which is formed by mutual diffusion of components of the internal electrode layer and the piezoelectric layer to the other layer and comprises at least one component of the piezoelectric material and Cu in the internal electrode layer as shown in FIG. 2.

A detailed explanation will be given below.

To fabricate the above-mentioned stacked piezoelectric device 1, a piezoelectric layer calcination step of calcining a ceramic green sheet as a piezoelectric material to obtain the piezoelectric layer 11 is performed.

In this example, to adopt PZT as the above-mentioned piezoelectric layer 11, a green sheet was prepared as follows. First, powders of lead oxide, zirconium oxide, titanium oxide, niobium oxide, strontium carbonate and the like making up the main materials of the piezoelectric material were weighed to obtain a predetermined composition. These component elements, however, were prescribed with lead richer by 1 to 2 percent than the stoichiometric composition, taking the volatilization of the lead component into consideration. The material thus prepared was dry mixed in a mixer and thereafter calcined at 800 to 950 degrees centigrade.

Subsequently, pure water and a dispersing agent were added to the resulting calcined powder to form a slurry, which was wet ground by a pearl mill. The powder thus ground was dried, degreased, added with a solvent, a binder, a plasticizer, a dispersing agent, and the like, and mixed in a ball mill. Thereafter, the resulting slurry was vacuum degassed while agitating by an agitator in a vacuum device to control viscosity.

Subsequently, the slurry was formed into a green sheet of a predetermined thickness by a doctor blade machine.

The resulting green sheet was punched in a press or cut by a cutter into a circular shape having a diameter of 15 millimeters. Of course, the green sheet may be formed into a quadrangle form, an ellipse form, a barrel form, or the like according to a desired shape of a stacked piezoelectric device.

Subsequently, in this example, the green sheet was degreased at 400 to 700 degrees centigrade in an electric furnace for a predetermined time and thereafter calcined at 900 to 1200 degrees centigrade for a predetermined time to obtain a piezoelectric layer 11. Thus, a calcined piezoelectric layer 11 having a thickness of 100 micrometers and consisting mainly of PZT which is a $Pb(Zr,Ti)O_3$-based oxide having a perovskite structure was obtained in this example.

Figure 4:
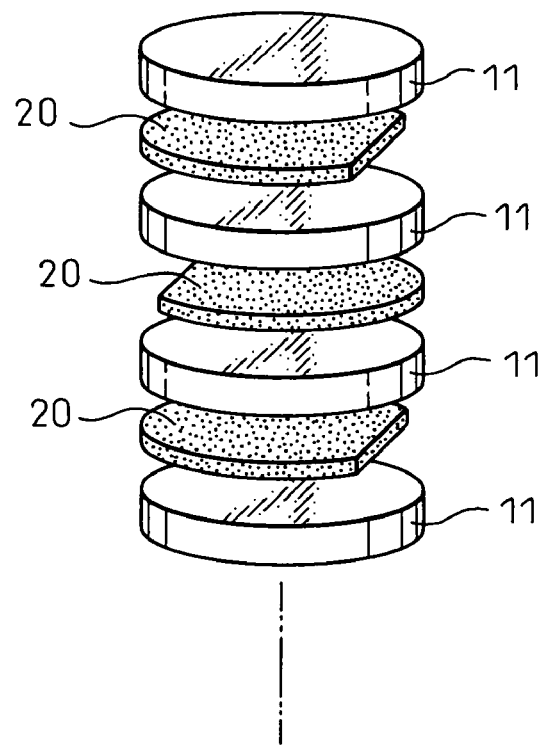
FIG. 4 is a perspective exploded view illustrating the stacking of piezoelectric layers and internal electrode layers according to Example 1.
Figure 5:
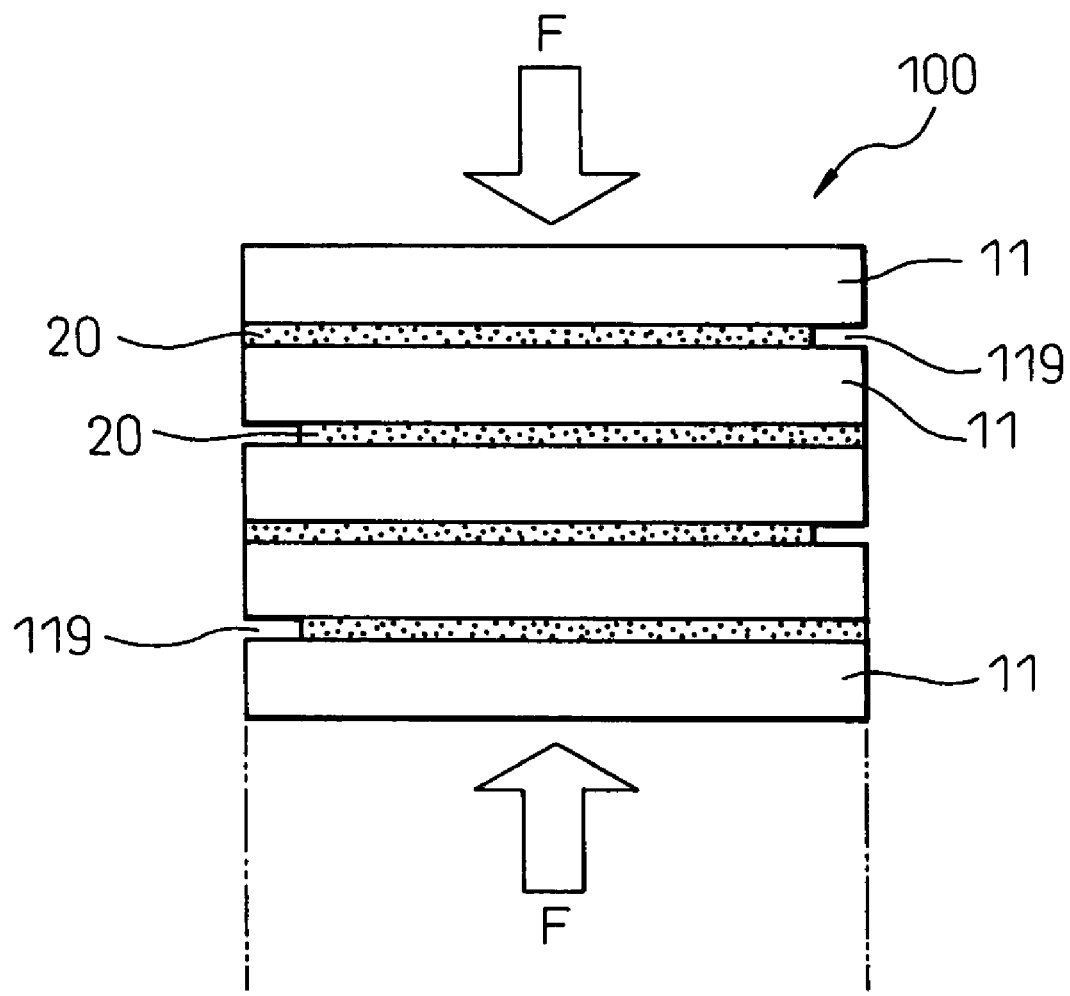
FIG. 5 is a diagram illustrating the application of a load to a stack in the stacking direction in a heat-bonding step according to Example 1.

Subsequently, as shown in FIGS. 4 and 5, a stack fabrication step was performed to stack the obtained piezoelectric layers 11 alternately with layers of electrode material 20 containing Cu to fabricate a stack.

Figure 3:
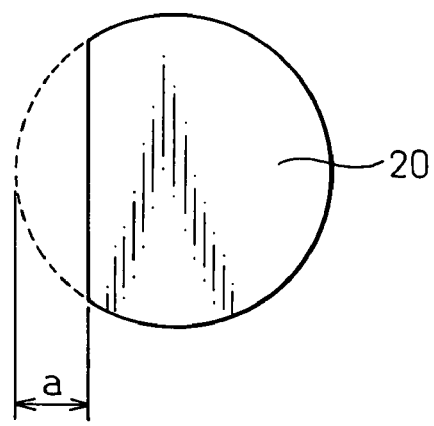
FIG. 3 is a diagram illustrating the shape of an electrode material used as an internal electrode layer according to Example 1.

In this example, a copper foil consisting of Cu having a purity of 99.9 percent and having a thickness of 3 micrometers was used as an electrode material 20. The used copper foil had a shape obtained by cutting off a part of a circle having a diameter of 15 millimeters in a straight line inside the periphery so that a distance a from the periphery may be 4 millimeters as shown in FIG. 3. Each electrode material 20 was placed so that the cut-off part thereof might be located in the opposite side alternately with that of the next electrode material as shown in FIGS. 4 and 5, and piezoelectric layers 11 and electrode materials 20 were stacked so that missing portions 119, where the electrode material 20 (internal electrode layer 21) does not cover the piezoelectric layer 11, might be formed with alternation of right and left, and a stack 100 was obtained as shown in FIGS. 1 and 5. In this example, fifty (50) piezoelectric layers 11 were stacked.

Subsequently, as shown in FIG. 5, a heat-bonding step of bonding the internal electrode layers 21 composed of the electrode material 20 and the piezoelectric layers 11 was performed by heating the stack 100 at a temperature higher than 850 degrees centigrade and not higher than the melting point of Cu in an oxidation-inhibiting atmosphere for preventing the Cu oxidizing while a predetermined load F was applied to the stack 100 in the direction of stacking.

More specifically, the stack 100 was placed in a furnace while a load F of about 3 MPa was applied in the direction of stacking. Subsequently, the inside of the furnace, in which the stack 100 was placed, was evacuated to a vacuum degree of $1 \times 10^{-2}$ Pa, and thereafter $N_2$ gas as inert gas was introduced into the furnace so that a pressure of 10 Pa might be maintained in the furnace.

Specifically, the stack was heated at a temperature of 960 degrees centigrade for about 10 minutes. It is thought that by heating to such a temperature, in the interface between an internal electrode layer 21 (electrode material 20) and a piezoelectric layer 11, Cu in the electrode material and Pb in PZT forms a Cu-rich liquid phase composed of Cu and Pb, which promotes formation of a diffusion layer.

In a stacked piezoelectric device 1 obtained according to the above-mentioned heat-bonding step, a piezoelectric layer 11 and an internal electrode layer 21 bond firmly to each other while each internal electrode layer 21 exposes alternately to the opposite side as shown in FIG. 1.

In this example, as shown in FIG. 2, a section parallel to the stacking direction of an interface between a piezoelectric layer 11 and an internal electrode layer 21 was analyzed by an X-ray microanalyser (EPMA). The result showed that a diffusion region having a thickness t of about 20 nanometers in which Pb, Cu and O elements coexist was formed in the interface between a piezoelectric layer 11 and an internal electrode layer 21.

The stacked piezoelectric device 1 according to this example employs a Cu-based material containing 95 percent by weight of Cu as an internal electrode layer 21. Therefore, compared with conventional stacked piezoelectric devices employing a noble metal such as Ag/Pd, the material cost can be reduced significantly and a cheaper stacked piezoelectric device can be obtained.

The above-mentioned stacked piezoelectric device 1 has a diffusion region formed between a piezoelectric layer 11 and an internal electrode layer 21. This diffusion region is formed by mutual diffusion of components of a piezoelectric layer and an internal electrode layer to the other layer, and contains Pb and O which are components of a piezoelectric material constituting a piezoelectric layer 11 and Cu constituting an internal electrode layer as mentioned above. An internal electrode layer 21 and a piezoelectric layer 11 are bonded to each other at a sufficient bonding strength because the diffusion region exists in the interface between them.

That is, a stacked piezoelectric device 1 according to the present invention has a sufficiently high bonding strength between an internal electrode layer 21 and a piezoelectric layer 11 and is inexpensive.

Next, an exemplified practical use of the stacked piezoelectric device 1 according to this example will be explained for reference. First, an epoxy-based resin is applied over the circumferential side surface of the stacked piezoelectric device 1 and degassed in vacuum and thereafter heat-treated at a temperature of 180 degrees centigrade for 10 minutes. Thereby, the missing portions 119, which are gaps between one piezoelectric layer 11 and another piezoelectric layer 11 resulting from the cut-off parts of the internal electrode layers 21 made of Cu foils as mentioned above, are filled with a filling 118 composed of the epoxy-based resin.

Figure 6:
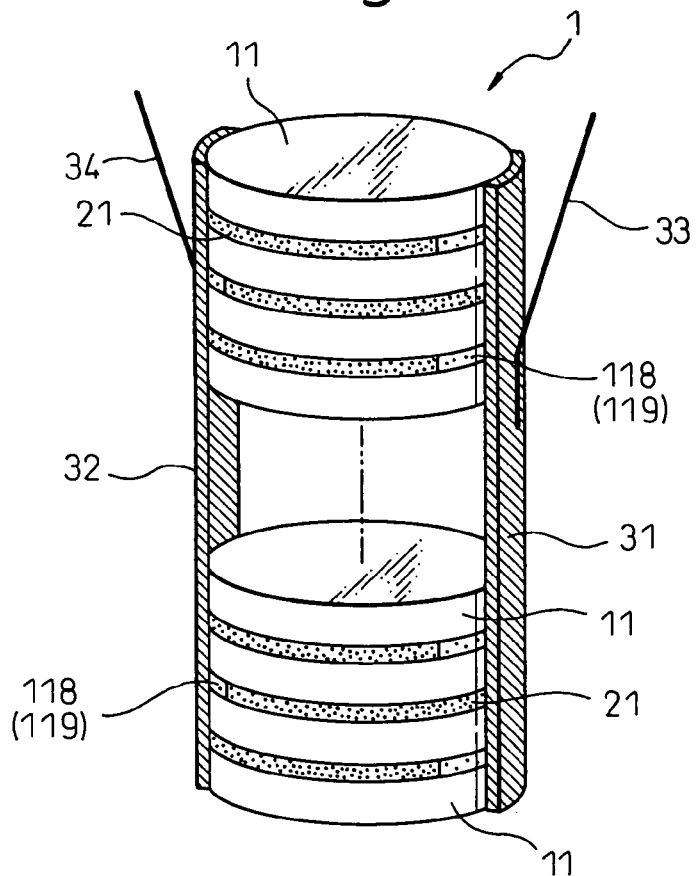
FIG. 6 is a diagram illustrating one embodiment of use of a stacked piezoelectric device according to Example 1.

Subsequently, as shown in FIG. 6, after grinding the circumferential side surface of the stacked piezoelectric device 1 to the diameter of 10 millimeters, a pair of external electrodes 31, 32 are formed by coating an epoxy-based electroconductive adhesive containing Ag filler on two opposite areas having the missing portions 119 of the circumferential side surface. Moreover, lead wires 33, 34 are connected to the external electrodes 31, 32.

The stacked piezoelectric device 1 thus formed can be made into an stacked piezoelectric device (stacked piezoelectric actuator), which is an embodiment when used practically, by immersing it in an insulating oil and polarizing it by application of direct current voltage through the lead wires 33, 34.

Example 2

In this example, instead of an electrode material 20 consisting of a copper foil in Example 1, a Cu film having a thickness of 3 micrometers was formed as an electrode material by nonelectrolytic plating on both the principal planes of a piezoelectric layer 11. Plated piezoelectric layers and non-plated piezoelectric layers were stacked alternately, and then heat-bonded in the same manner as in Example 1 to obtain a stacked piezoelectric device.

Evaluation of the condition of bonding between an internal electrode layer and a piezoelectric layer of the obtained stacked piezoelectric device by observing a section thereof showed that the stacked piezoelectric device of this example had as good bonding condition as that of Example 1.

Example 3

In this example, in order to clarify further the superiority of the stacked piezoelectric device 1 obtained in Example 1, comparative samples including a conventional sample were prepared, and a test for comparing the bonding strength of the samples was performed.

The conventional sample was prepared as follows:

First, a green sheet was formed in the same manner as in Example 1, and an electrode material was printed on one side of the green sheet by screen printing. A paste of silver and palladium (hereinafter referred to as a Ag/Pd paste) having an Ag/Pd ratio of 7/3 was used as the electrode material.

Subsequently, the printed green sheets were stacked to form a stack, which was thermocompression-bonded by a warm water rubber press and the like, was degreased at 400 to 700 degrees centigrade in an electric furnace, and was calcined at 900 to 1200 degrees centigrade to obtain a stacked piezoelectric device as conventional sample, which is referred to as Sample C1.

In addition to the stacked piezoelectric device of Example 1, which is referred to as Sample E1, Samples C2 and C3 as comparative samples were prepared in the same manner as in Example 1 except changing the heating temperature in the heat-bonding step to 800 degrees centigrade and 850 degrees centigrade, respectively.

The bonding strength between a piezoelectric layer and an internal electrode layer of Samples E1, C1, C2 and C3 was measured by tensile test in the stacking direction of each sample. The measured value was expressed as a bonding strength ratio, which is defined as a ratio of bonding strength of each sample to bonding strength of the conventional sample C1.

Figure 7:
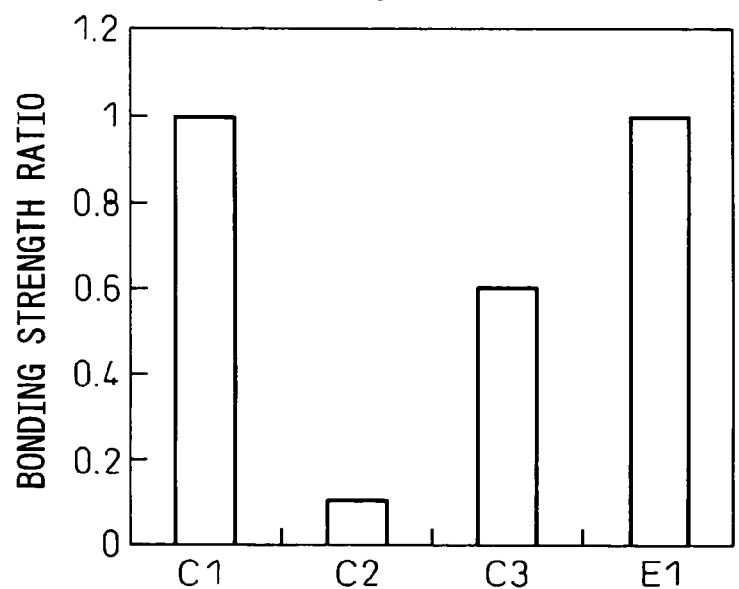
FIG. 7 is a diagram showing the bonding strength ratio of each sample in Example 3.

The test results were shown in FIG. 7, which has sample numbers along the abscissa and a bonding strength ratio along the ordinate.

As seen in FIG. 7, the stacked piezoelectric device 1 according to Example 1 (Sample E1) had an excellent bonding strength equal to that of the conventional sample (Sample C1).

As opposed to this, Samples C2 and C3, which were heated at a temperature of not more than 850 degrees centigrade in the heat-bonding step, had a inferior bonding strength to that the conventional sample (Sample C1). It is considered to be the cause that a heating temperature of not more than 850 degrees centigrade does not soften a copper foil as an electrode material sufficiently and therefore does not bring a copper foil into enough contact with a piezoelectric material to make a diffusion region between an internal electrode layer and a piezoelectric layer.

Example 4

In this example, the effect which the oxidation-inhibiting atmosphere in the heat-bonding step in a method of fabricating a stacked piezoelectric device on a dielectric property of a stacked piezoelectric device was checked using a single disk of piezoelectric material used for a stacked piezoelectric device.

First, gold was vapor-deposited on both principal planes of a calcined piezoelectric disk having a diameter of 15 millimeters and a thickness of 100 micrometers, which was not subjected to the oxidation-inhibiting atmosphere in the heat-bonding step, to prepare a gold-deposited calcined piezoelectric disk (Sample C4) as a comparative example used as a basis.

Next, a calcined piezoelectric disk was subjected to the same oxidation-inhibiting atmosphere as that in the heat-bonding step in Example 1, and thereafter gold was vapor-deposited on both principal planes of the piezoelectric disk to prepare a gold-deposited calcined piezoelectric disk (Sample E2). Although the oxidation-inhibiting atmosphere in the heat-bonding step in Example 1 was provided by introducing inert gas into the furnace at a predetermined pressure after the furnace was evacuated as mentioned above, a calcined piezoelectric disk was heated at a vacuum degree of $10^{-2}$ Pa without introduction of inert gas after the furnace was evacuated to such a vacuum degree and thereafter gold was vapor-deposited on both principal planes of the heat-treated piezoelectric disk to prepare a gold-deposited calcined piezoelectric disk (Sample C5) as a comparative example.

Figure 9:
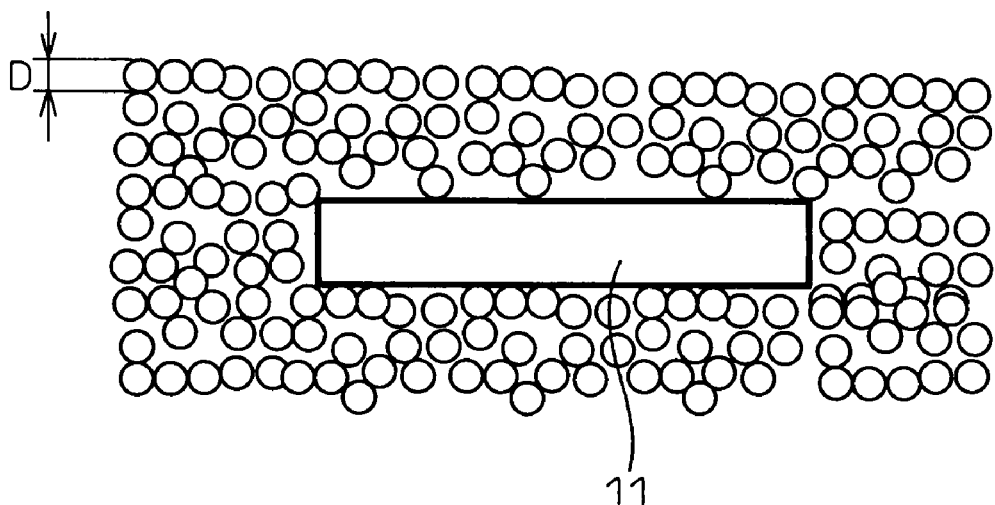
FIG. 9 is a diagram illustrating the state of forming an oxidation-inhibiting atmosphere in the heat-bonding step when preparing Sample E2 in Example 4.

Moreover, as shown in FIG. 9, a calcined piezoelectric disk 11 was placed in a furnace, and the circumference of the calcined piezoelectric disk 11 was filled with oxide ceramic powder 92, and then the inside of the furnace was evacuated to a vacuum degree of $10^{-2}$ Pa to obtain an oxidation-inhibiting atmosphere, where the calcined piezoelectric board 11 was heated, and thereafter gold was vapor-deposited on both principal planes of the heat-treated piezoelectric disk to prepare a gold-deposited calcined piezoelectric disk (Sample E3). In this case, lead zirconate having an average particle diameter of about 10 micrometers was used as oxide ceramic powder 92.

Then, each sample was tested for determining a piezoelectric constant d31 (pm/V) which is one of the piezoelectric properties.

In this test, an impedance measuring instrument was used. One surface of each sample was connected to the positive (+) terminal of the impedance measuring instrument and the other surface was connected to the negative (−) terminal. Resonant frequency and antiresonant frequency were measured, and a piezoelectric constant d31 was calculated.

Figure 8:
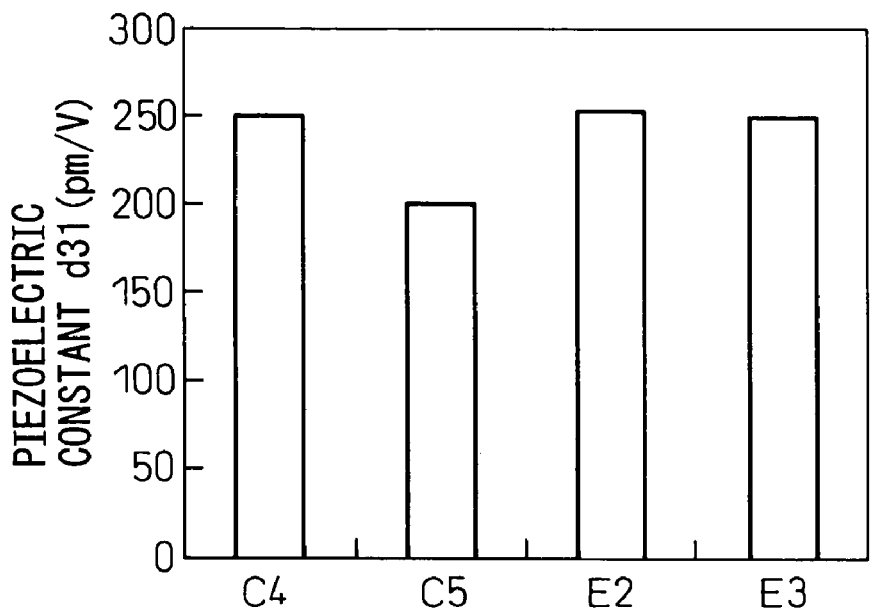
FIG. 8 is a diagram showing the piezoelectric constant d31 of each sample in Example 4.

The test result is shown in FIG. 8, which takes sample No. along the abscissa and a piezoelectric constant d31 (pm/V) along the ordinate.

As seen from FIG. 8, Samples E2 and E3 had a piezoelectric property equivalent to that of Sample C4 which was not subjected to the oxidation-inhibiting atmosphere. Sample C5 is inferior in the piezoelectric property by about 20 percent, with respect to Sample C4.

The above-mentioned result showed that only evacuation was inadequate for an oxidation-inhibiting atmosphere in the heat-bonding step, and that additional measures were necessary.

The additional measures include charging inert gas such as nitrogen into the furnace at a pressure of not less than 1 Pa after the evacuation, evacuating the inside of the furnace after filling oxide ceramic powder around the stack in the furnace, controlling an oxygen partial pressure in the furnace to a predetermined pressure after the evacuation, and the like.

Example 5

Figure 10:
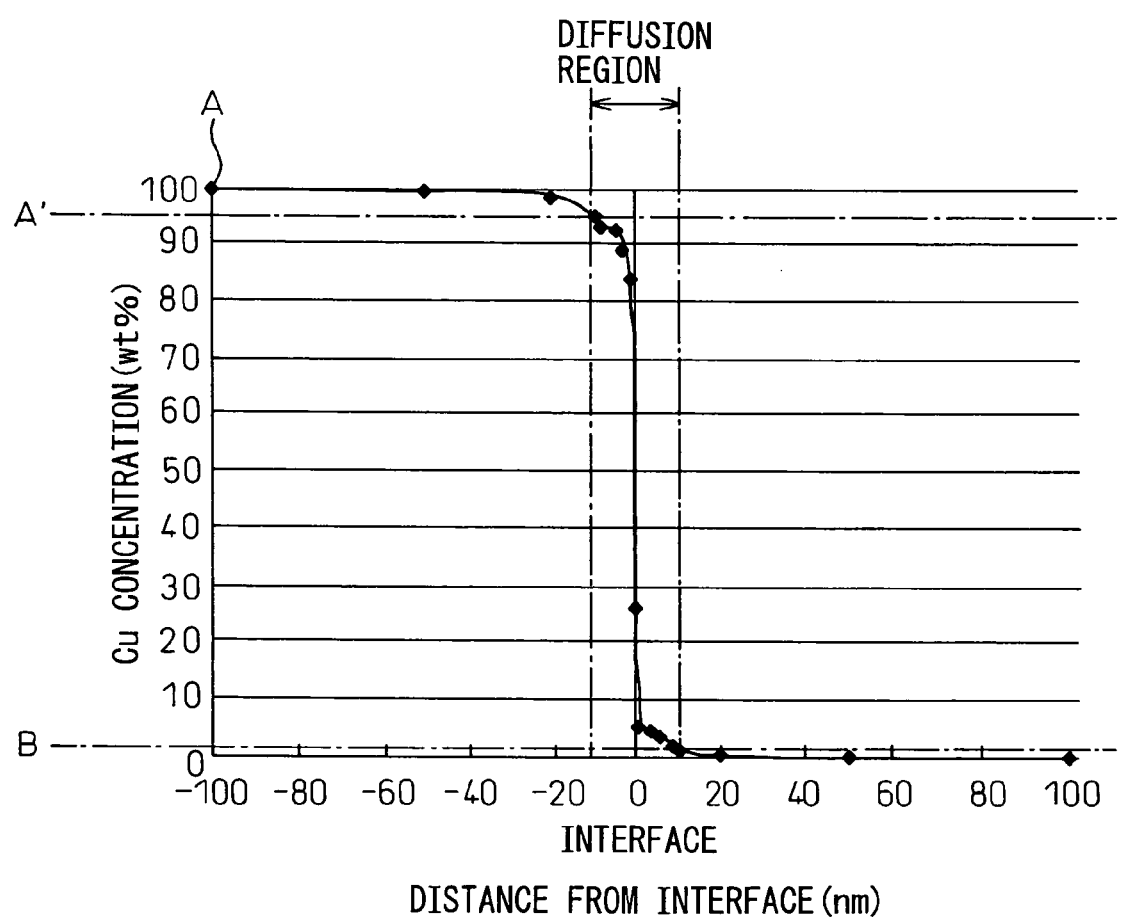
FIG. 10 is a diagram showing change of Cu concentration in the diffusion region in Example 5.

In this example, the section in the stacking direction of the stacked piezoelectric device 1 prepared in Example 1 was measured by EPMA with a beam diameter of 1 nanometer. A result is shown in FIG. 10, which takes a distance from the interface near the diffusion region along the abscissa and a Cu concentration (percent by weight) along the ordinate.

As pure Cu having a purity of 99.9 percent was used as an internal electrode layer 21, A' expressed by 0.95A becomes about 95 percent by weight. A distance from position A' where a Cu concentration is 95 percent via the interface to position B where a Cu concentration is 1 percent by weight was about 20 nanometers as seen from FIG. 10.

Example 6

In this example, a section in the stacking direction of the stacked piezoelectric device 1 prepared in Example 1 was analyzed by EDX to determine an oxygen content at four points (1, 3, 5, and 10 nanometers from the interface) of the diffusion region on the side of the internal electrode layer.

The result showed that the oxygen content was less than 8 percent by weight.

The invention claimed is:

1. A stacked piezoelectric device comprising piezoelectric layers composed of a piezoelectric material and internal electrode layers containing Cu, each of the piezoelectric layers being stacked alternately with each of the internal electrode layers, wherein the internal electrode layer contains not less than 50 percent by weight of Cu element, and wherein, between the internal electrode layer and the piezoelectric layer, there is a diffusion region formed by mutual diffusion of components of the internal electrode layer and the piezoelectric layer to the other layer and comprising at least one component of the piezoelectric material and Cu, wherein the diffusion region occupies not less than 90 percent of an area of the whole interface between the internal electrode layer and the piezoelectric layer, and a thickness of the diffusion region is not more than 10 percent of a thickness of the internal electrode layer.

2. A stacked piezoelectric device according to claim 1, wherein the internal electrode layer contains not less than 95.0 percent by weight of Cu element.

3. A stacked piezoelectric device according to claim 1, wherein the internal electrode layer contains not less than 99.0 percent by weight of Cu element.

4. A stacked piezoelectric device according to claim 1, wherein the internal electrode layer is composed of a pure copper metal containing not less than 99.0 percent by weight of Cu element.

5. A stacked piezoelectric device according to claim 1, wherein the internal electrode layer is composed of a copper alloy containing not less than 95.0 percent by weight of Cu element.

6. A stacked piezoelectric device according to claim 1, wherein the diffusion region is a region having a Cu concentration of 1 percent to 0.95 A percent by weight, wherein A represents Cu element content in percent by weight in the internal electrode layer.

7. A stacked piezoelectric device according to claim 1, wherein a thickness of the diffusion region is from 0.001 to 1 micrometer.

8. A stacked piezoelectric device according to claim 1, wherein the diffusion region exists continuously in both sides of an interface of the internal electrode layer and the piezoelectric layer, and the interface is located in the diffusion region, and wherein a part, closer to the internal electrode layer than the interface, of the diffusion region has an oxygen (O) content of not more than 10 percent by weight.

9. A stacked piezoelectric device according to claim 1, wherein the piezoelectric material constituting the piezoelectric layer comprises PZT which is a $Pb(Zr,Ti)O_3$-based oxide having a perovskite structure, and Pb, Cu, and O elements coexist in the diffusion region.

10. A stacked piezoelectric device according to claim 1, which is a piezoelectric actuator for an injector used as a driving source of an injector.

* * * * *